United States Patent [19]

Wen et al.

[11] Patent Number: 5,861,341
[45] Date of Patent: Jan. 19, 1999

[54] PLATED NICKEL-GOLD/DIELECTRIC INTERFACE FOR PASSIVATED MMICS

[75] Inventors: Cheng P. Wen, Mission Viego; Wah S. Wong, Montebello; Arlene E. Arthur, Torrance, all of Calif.

[73] Assignee: Raytheon Company, El Segundo, Calif.

[21] Appl. No.: 680,453

[22] Filed: Jul. 15, 1996

[51] Int. Cl.[6] .................................................. H01L 21/441
[52] U.S. Cl. ........................ 438/628; 438/650; 438/654; 257/753; 257/766
[58] Field of Search .................................. 438/654, 686, 438/644, 628, 650; 257/753, 766

[56] References Cited

U.S. PATENT DOCUMENTS

| | | | |
|---|---|---|---|
| 4,674,176 | 6/1987 | Tuckerman | 438/626 |
| 4,770,897 | 9/1988 | Wu | 438/628 |
| 4,794,093 | 12/1988 | Tong et al. | 148/DIG. 26 |
| 5,376,574 | 12/1994 | Peterson | 438/612 |
| 5,406,122 | 4/1995 | Wong et al. | 257/753 |
| 5,730,853 | 3/1998 | Smith et al. | 205/210 |

*Primary Examiner*—John F. Niebling
*Assistant Examiner*—Ha Tran Nguyen
*Attorney, Agent, or Firm*—Leonard A. Alkov; William C. Schubert; Glenn H. Lenzen, Jr.

[57] ABSTRACT

A thin film (at least one atomic layer to about 400 Å) of nickel is electrolytically plated on top of electrolytically-plated gold electrodes in GaAs monolithic microwave integrated circuits (MMICs) without any additional photoresist masking step. The thin electrolytically-plated nickel film improves adhesion of a passivating dielectric layer (e.g., silicon dioxide, silicon nitride, and silicon oxynitride) formed on the electrolytically-plated gold electrodes. The electrolytically-plated nickel film can be removed locally to facilitate the fabrication of plated silver bumps (for off-chip electrical connections and thermal paths) on passivated flip chip MMICs.

7 Claims, 1 Drawing Sheet

PLATED NICKEL-GOLD/DIELECTRIC INTERFACE FOR PASSIVATED MMICS

BACKGROUND OF THE INVENTION

1. Field of the Invention

The present invention relates to the fabrication of GaAs monolithic microwave integrated circuits (MMICs), and, more particularly, to a method of improving adhesion of a dielectric layer on electrolytic gold plated electrodes.

2. Description of Related Art

Any exposed metal on the surface of a conventional MMIC is of serious reliability concern. The unprotected circuit elements risk being damaged during subsequent processing operations, including backside processing, on-wafer testing, wafer dicing, die pick-and-place, die attachment, off-chip electrical interconnect, and final cleaning and packaging. Accordingly, a dielectric coating, such as silicon dioxide, silicon nitride, silicon oxynitride, silicon carbide, or diamond, is often used to provide added protection against environmental attacks such as by chemicals, dirt, moisture, etc., and mechanical scratches, such as tweezer marks, handling tool marks, etc., making the MMIC chips more robust and more "silicon-like". A description of the formation and passivation of MMICs is given in U.S. Pat. No. 5,406,122, entitled "Microelectronic Circuit Structure Including Conductor Bridges Encapsulated in Inorganic Dielectric Passivation Layer", issued Apr. 11, 1995.

Gold-based metallization is widely used on MMIC chips. However, dielectric passivation coatings deposited directly on the gold surface often crack or peel when the part is subjected to thermal cycling. A thin (200 to 500 Å) layer of titanium or chromium is commonly inserted between the gold-based electrodes and the dielectric passivation coatings of MMICs to promote dielectric-metal adhesion, which is critical to the reliability of the devices.

Titanium or chromium deposition is compatible with MMIC fabrication processes when evaporated or sputtered gold is used for electrode formation. However, thick (several micrometers) electrolytically-plated gold is required to form electrical crossovers to boost the power handling capability of electrical interconnects and to increase the Q-factor of the RF circuit elements. Titanium or chromium deposition is not compatible with the electrolytic gold plating process.

Accordingly, a need exists for preventing cracking or peeling of dielectric layers of MMIC devices formed on electrolytically-plated gold.

SUMMARY OF THE INVENTION

In accordance with the present invention, a thin layer (at least one atomic layer to about 400 Å) of nickel is electrolytically plated on top of the electrolytically-plated gold electrodes without any additional photoresist masking step. The thin plated nickel film improves adhesion of dielectric coatings, such as silicon dioxide, silicon nitride, and silicon oxynitride, on electrolytic-plated gold electrodes of passivated MMICs. The nickel film can be removed locally to facilitate the fabrication of plated silver bumps (for off-chip electrical connections and thermal paths) on passivated flip chip MMICs.

DESCRIPTION OF THE PREFERRED EMBODIMENTS

The plated nickel-gold dielectric interface process of the present invention, as described below, provides a highly reliable passivated MMIC.

Several micrometers thick electrolytically-plated gold electrical interconnects, transmission line segments and electrodes are frequently required on MMICs to form crossovers to boost the power-handling capability and the Q-factor of circuit elements. However, the previously-used titanium or chromium deposition is incompatible with electrolytic plating. An alternative dielectric/gold interface metal scheme is required.

Electrolytically-plated nickel has been found to meet the dielectric-coated MMIC processing requirements. In accordance with the present invention, a thin layer (up to several hundred Ångstroms) of nickel is electrolytically plated on top of the electrolytically-plated gold electrodes without the need of additional photolithographic steps. Silicon dioxide protective coatings (from 0.5 to 2 micrometers thick), such as deposited by plasma enhanced chemical vapor deposition, are found to adhere well to the surface of the electrolytically-plated nickel (FIG. 1), showing no signs of cracking or peeling when the samples are subjected to thermal shock.

Figure 1:
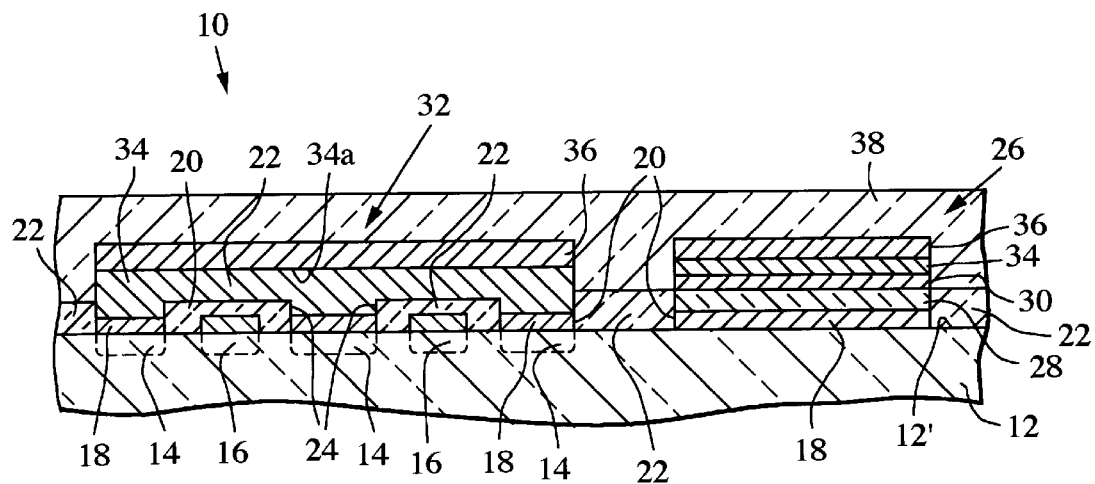
FIG. 1 is a cross-sectional view, depicting electrolytically-plated nickel interface metallization on top of electrolytically-plated gold electrodes, in accordance with one embodiment of the present invention.

Specifically, FIG. 1 depicts a portion of a GaAs MMIC 10 comprising a substrate 12 in which source regions 14 and drain regions 16 have been formed. A first adhesion film 18, such as a multilayer film comprising Ti/Au/Ti, and, optionally, ohmic contact Au/Ge, is formed on the surface 12' of the substrate 12 by evaporation or sputtering. The thickness of the individual metal layers is not critical in the practice of the present invention and is within the parameters commonly employed for these multilayer metal films.

The first multilayer film 18 is patterned to make contact either with doped source regions 14 and doped drain regions 16 in the substrate 12 or with the substrate itself. The adhesion film 18 is patterned by blanket-deposition through openings in a photoresist mask (not shown), which has been patterned to expose those areas where the adhesion film and subsequent passivation layer are to be deposited. The photoresist mask is stripped, leaving the patterned adhesion film 18 intact, with spaces 20 therebetween.

An inorganic layer 22, such as silicon dioxide, is deposited and patterned to form openings 24 to expose portions of the underlying adhesion film 18 while providing isolation between contacts 18 to neighboring source regions 14 and drain regions 16. While other inorganic materials, such as silicon nitride and silicon oxynitride, may be employed as layer 22, silicon dioxide is preferred.

An integrated capacitor, shown generally at 26, is formed by depositing a dielectric layer 28, such as silicon nitride, on portions of the first adhesion film 18, followed by deposition of a second adhesion film 30 on the dielectric layer 28. The second adhesion film 30 has the same composition and is deposited in the same manner as the first adhesion film 18. Other devices, such as a plated gold bridge interconnect, shown generally at 32, to be formed in subsequent processing steps described below, are masked during this portion of the process in forming the integrated capacitor 26.

A plated gold layer bridge layer 34 is deposited on those exposed portions of the first and second adhesion films 18, 30. The plating is performed by electrolytic plating, employing conventional plating parameters.

The gold layer 34 is formed after a plating membrane mask (not shown) is deposited and patterned to expose the areas over those portions of the adhesion films 18, 30 where gold deposition is desired. The adhesion films 18, 30, which at this stage are continuous, are employed as one of the plating electrodes.

Since the plating is electrolytic, gold will deposit only where there is an exposed electrically conductive layer, such as adhesion films 18, 30 from which the top layer has been removed to expose the underlying Au layer. The electrolytically-plated gold layer 34 is deposited to a thickness in the range of about 2.5 to 3.5 $\mu$m, and typically about 3.0 $\mu$m. The gold plating solution is conventional, employing a commercially-available bath. The gold plating is performed using conventional operating parameters.

In accordance with the present invention, a nickel film 36 is electrolytically plated on the gold layer 34. Again, since this is an electrolytic process, the electrolytically-plated nickel film 36 will be deposited only where there is a gold layer 34. A conventional nickel plating solution is employed, such as a commercially-available bath. The nickel plating is performed using conventional operating parameters.

The nickel film 36 is deposited to a thickness within the range of at least one atomic layer to about 400 Å. At least one atomic layer is required to provide adequate adhesion. Due to the difficulty in removing relatively thick nickel films, the nickel film thickness is preferably kept below 400 Å. More preferably, the nickel film thickness is in the range of about 100 to 400 Å.

Finally, a dielectric protective layer 38 is deposited to encapsulate the sides and top portions of the various devices 26, 32 for protection. The dielectric layer 38 typically comprises $SiO_2$ and is formed to a thickness within the range of about 0.5 to 2 $\mu$m, as is well-known. The dielectric layer 38 is deposited using well-known processes. Preferably, non-directional deposition processes, such as sputtering and plasma-enhanced chemical vapor deposition (PECVD), are employed. Other inorganic dielectric layers, such as silicon nitride and silicon oxynitride, may be employed in place of silicon dioxide.

As a consequence of employing the nickel film 36 of the present invention, the passivating dielectric layer 38 remains adhered to the electrolytically-plated nickel layer 36 even when the MMIC 10 is exposed to changes in temperature.

Figure 2:
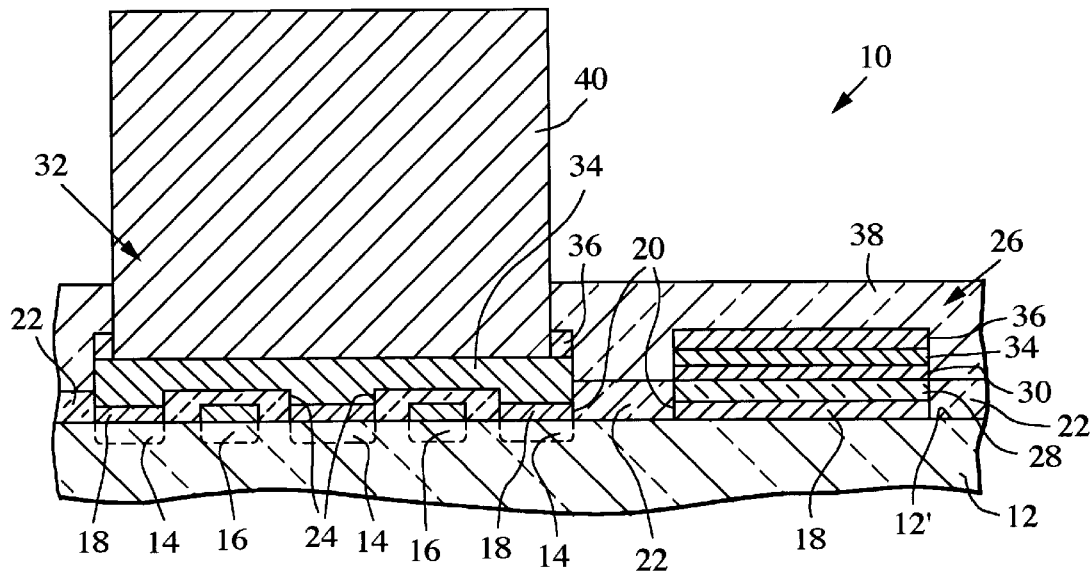
FIG. 2 is a cross-sectional view similar to FIG. 1, but showing a plated silver bump on top of plated gold electrodes after removal of a portion of the nickel interface depicted in FIG. 1.

Further in accordance with the present invention, the plated nickel film 36 may be removed at selected areas to facilitate formation of plated silver bumps 40 as a part of the flip-chip MMIC fabrication process. As shown in FIG. 2, the silver bumps 32 are plated on top of the exposed gold surface 34a after the nickel film 36 is chemically etched away, advantageously employing a commercially-available etchant. The end point of etching is easily determined, due to the comparatively different appearance of the gold layer 34 and the nickel film 36.

The gold surface 34a is exposed by first patterning the dielectric layer 38 and then etching through the dielectric layer to expose a portion of the gold surface. Advantageously, a portion of the gold surface is left protected by the nickel film 36 and the dielectric layer 38 for improved adhesion of the dielectric layer to the gold layer 34.

This portion of the process of the present invention is useful for the formation of conventional silver bumps (for off-chip electrical interconnection) as well as silver thermal bumps which are attached to the plated gold bridges connecting the source electrodes of multi-cell field effect transistors on flip-chip MMICs (for both heat sinking and electrical interconnection).

The process of the present invention provides passivated GaAs flip chip MMICs having improved reliability.

Thus, there has been disclosed a process for improving dielectric passivation of GaAs MMIC devices and a structure having such improved dielectric passivation. It will be readily appreciated by those skilled in this art that various changes and modifications of an obvious nature may be made, and all such changes and modifications are considered to fall within the scope of the present invention, as described by the appended claims.

What is claimed is:

1. In an improved process for forming a gallium arsenide monolithic microwave integrated circuit comprising a plurality of devices which include an electrolytically-plated gold layer as an electrically conductive contact, said plurality of devices being encapsulated by a passivating dielectric layer, wherein the improvement comprises:

(a) electrolytically plating said gold layer;

(b) electrolytically plating a nickel film on said gold layer; and (c) depositing said passivating dielectric layer over said electrolytically-plated nickel film so as to encapsulate side and top portions of said plurality of devices, whereby said passivating dielectric layer remains adhered to said electrolytically-plated nickel layer when exposed to changes in temperature.

2. The process of claim 1 wherein said nickel film is deposited to a thickness within the range of at least one atomic layer to about 400 Å.

3. The process of claim 1 additionally including the steps of (d) removing portions of said passivating dielectric layer to expose portions of said electrolytically-plated nickel film;

(e) removing portions of said electrolytically-plated nickel film to expose portions of said electrolytically-plated gold layer; and (f) depositing silver bump contacts on said exposed portions of said electrolytically-plated gold layer.

4. The process of claim 3 wherein portions of said electrolytically-plated nickel film remain unexposed during removal of said portions of said passivating dielectric layer for maintaining adhesion of said passivating dielectric layer to said electrolytically-plated gold layer.

5. The process of claim 3 wherein said silver bump contacts are deposited by a process selected from the group consisting of electrolytic plating and thermal deposition.

6. The process of claim 1 wherein said passivating dielectric layer comprises a material selected from the group consisting of silicon dioxide, silicon nitride, and silicon oxynitride.

7. The process of claim 6 wherein said passivating dielectric layer consists essentially of silicon dioxide and has a thickness within the range of about 0.5 to 2 $\mu$m.

* * * * *